United States Patent [19]

Higashiyama

[11] Patent Number: 5,038,934
[45] Date of Patent: Aug. 13, 1991

[54] MICROCAPSULE-CARRYING SHEET STORAGE CARTRIDGE AND METHOD OF SEALING THE SAME

[75] Inventor: Shunichi Higashiyama, Yokkaichi, Japan

[73] Assignee: Brother Kogyo Kabushiki Kaisha, Japan

[21] Appl. No.: 564,557

[22] Filed: Aug. 9, 1990

[30] Foreign Application Priority Data

Aug. 29, 1989 [JP] Japan .................. 1-222317

[51] Int. Cl.⁵ .................. B65D 81/24; B65B 31/02; G03B 27/58
[52] U.S. Cl. .................. 206/454; 53/432; 53/467; 206/213.1; 206/389; 206/409; 206/524.4; 355/27; 355/72
[58] Field of Search .................. 206/205, 213.1, 389, 206/397, 409, 449, 454-456, 524.1, 524.4; 53/432, 433, 467, 471; 355/27, 72

[56] References Cited

U.S. PATENT DOCUMENTS

| 3,340,668 | 9/1967 | Bofinger | 53/432 X |
| 3,369,859 | 2/1968 | Cornelius | 206/205 |
| 3,801,011 | 4/1974 | Guehler et al. | 206/205 X |
| 4,091,924 | 5/1978 | Newton | 206/389 |
| 4,236,633 | 12/1980 | Ernerot | 206/213.1 |
| 4,399,209 | 8/1983 | Sanders et al. | |
| 4,671,409 | 6/1987 | Espy | 206/397 |
| 4,821,876 | 4/1989 | Naito et al. | 206/395 X |
| 4,861,695 | 8/1989 | Higashiyama | |
| 4,865,942 | 9/1989 | Gottschalk et al. | |
| 4,870,801 | 10/1989 | Mizandjian et al. | 53/432 |
| 4,916,478 | 4/1990 | Tsujimoto et al. | 355/27 |
| 4,919,955 | 4/1990 | Mitchell | 206/213.1 X |

FOREIGN PATENT DOCUMENTS 63-198047 12/1988 Japan .

Primary Examiner—Bryon P. Gehman
Attorney, Agent, or Firm—Oliff & Berridge

[57] ABSTRACT

A cartridge case in which a microcapsule-carrying sheet to be used as an image recording medium is stored, is filled with a non-oxidative gas which makes it possible to store the microcapsule-carrying sheet for extended periods without affecting its performance. Nitrogen gas or inert gas such as neon, argon, helium, and xenon is suitable as the non-oxidative gas.

27 Claims, 2 Drawing Sheets

MICROCAPSULE-CARRYING SHEET STORAGE CARTRIDGE AND METHOD OF SEALING THE SAME

BACKGROUND OF THE INVENTION

1. Cross-Reference

This application contains subject matter technically related to subject matter in U.S. patent application Ser. No. 549965 filed July 9, 1990 (JAO 0041) by the same inventor. The related application discloses a packaging container for developer sheets rather than the capsule sheets of this disclosure 2. Field of the Invention The present invention relates to a cartridge in which a capsule sheet is stored. More specifically, the invention relates to a cartridge which is suitable for storing a capsule sheet used as an image recording medium.

3. Description of the Related Art

A photo sensitive microcapsule sheet used as the image recording medium is described for example, in U.S. Pat. No. 4,399,209, the disclosure of which is herein incorporated by reference. On the base sheet of this kind of capsule sheet are spread the microcapsules which contain the photopolymerization material, the polymerization initiator, and the dyeprecursor as a principal ingredient.

This capsule sheet is usually rolled and stored in the cartridge because the sheet is photosensitive. The storage condition is described in U.S. Pat. No. 4,861,695, the disclosure of which is herein incorporated by reference. In the description of the above U.S. Patent, the capsule sheet was stored in a cartridge case made of paper or plastic and the case was wrapped with a plastic film which has low airtightness. Therefore, the capsule sheet in the above cartridge case was easily exposed to outside air through the plastic film while being stored. As a result, the microcapsules on the contaminated capsule sheet are oxidized, so as not to harden or stiffen even if irradiated with light and the quality of the capsule sheet deteriorates. This deterioration of the qualitY is caused by the air infiltrating the cartridge case. As a result, the quality of the record image deteriorates. That is, when a latent image is formed on the capsule sheet by light exposure and developed by a pressing force into a superposed developer sheet, not only the microcapsules in the non-exposure area but also the microcapsules in the exposure area are destroyed. Thus, a clear image cannot be reproduced by the chemical reacting of the developer sheet.

SUMMARY OF THE INVENTION

An object of this invention is to provide a cartridge which can store the capsule sheet for a long term.

This object is achieved by the cartridge case of the present invention by having the cartridge case for storing the capsule sheet filled with a non-oxidative gas. In this case, a nitrogen gas or inert gas such as helium, neon, argon, and xenon is suitable as the non-oxidative gas.

Another object of this invention is to provide a cartridge which can store the capsule sheet for a long term even if a drawer entrance for withdrawal of the capsule sheet is installed in the cartridge case.

This object is achieved by the cartridge case of the present invention by having the cartridge case with the drawer entrance for the capsule sheet, sealed by wrapping a film close to said drawer entrance to seal the cartridge after filling of the cartridge with a non-oxidative gas. In this case a sheet laminated with a synthetic resin film and an ionomer film is suitable as the wrapping film.

In addition, in this invention, a clear image can be reproduced with a lesser amount of exposure light than that required to expose a capsule sheet stored in a cartridge without a non-oxidative gas.

BRIEF DESCRIPTION OF THE DRAWINGS

The invention will be described in detail with reference to the following drawings, wherein.

DETAILED DESCRIPTION OF THE PREFERRED EMBODIMENT

Figure 1:
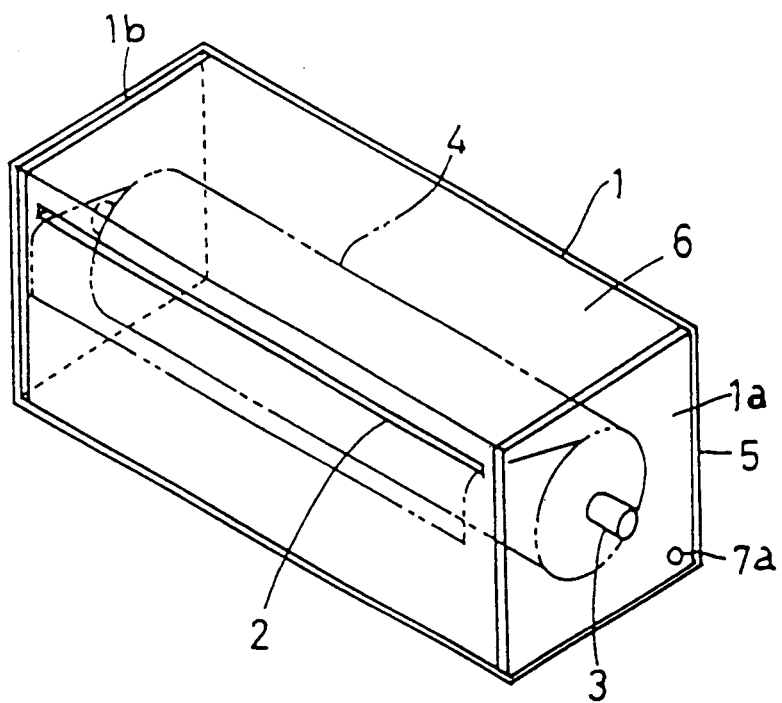
FIG. 1 is an external perspective view of the cartridge where the capsule sheet is stored.
Figure 2:
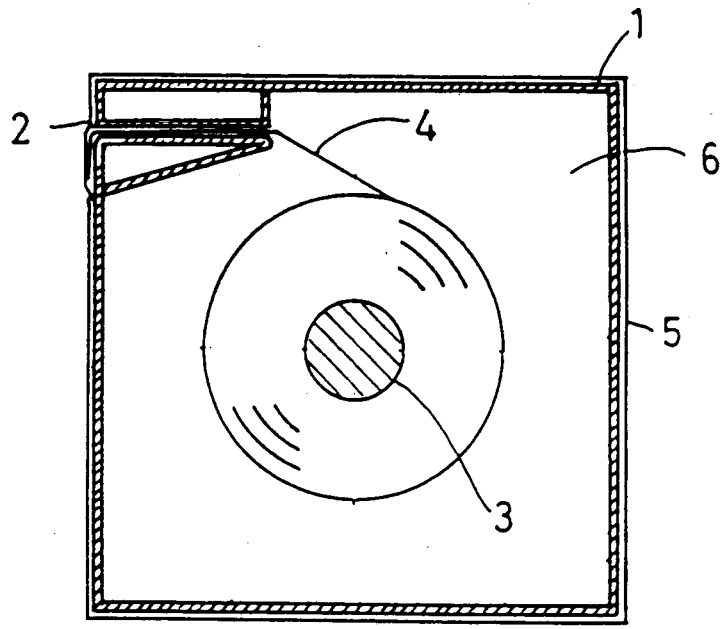
FIG. 2 is a sectional view of the cartridge.

A detailed description of one preferred embodiment of the present invention will now be given referring to the accompanying drawings. As shown in FIG. 1 and FIG. 2, a supply shaft 3 is located in a rectangular cartridge case 1 and a capsule sheet 4 is rolled on the supply shaft 3. The cartridge 1 preferably is a sealed housing made of opaque material to minimize exposure of the capsule sheet 4 to exterior light. Preferably, the supply shaft 3 is supported by side plates 1a of the cartridge case. A drawer entrance 2 is installed in the cartridge case 1 and the leader portion of the capsule sheet 4 is drawn out from the drawer entrance 2 for withdrawal of the sheet 4 from the case 1. An injection port 7a of non-oxidative gas 6 is installed in a side plate 1a of the cartridge case preferably at a location remote from the drawer entrance 2. The exterior of the cartridge case 1 is covered with a wrapping film 5.

The wrapping method of this cartridge case is now explained. First, the capsule sheet 4 is stored in the cartridge case 1. Then, non-oxidative gas 6 is injected through the injection port 7a into the cartridge case 1. At this time, the air in the cartridge case 1 is exhausted from the drawer entrance 2. Locating the injection port 7a at a location remote from the drawer entrance ensures that air exhausts from the container as non-oxidative gas fills the container since locating the injection port at a close location relative to the drawer entrance 2 could result in transfer of non-oxidative directly out through the drawer entrance with insufficient exhaust of air. The exterior of the cartridge case 1 is then covered with the wrapping film 5. Nitrogen gas or inert gas such as neon, argon helium, and xenon is used as the non-oxidative gas 6.

Figure 3:
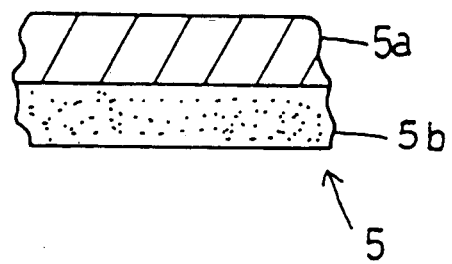
FIG. 3 is an expanded sectional view of the wrapping film.

FIG. 3 shows the expanded sectional view of the wrapping film 5. The sheet 5 is a laminated sheet with a polyethyleneterephthalate film 5a having a thickness of about 25 $\mu$m and an ionomer film 5b having a thickness of about 30 $\mu$m. The ionomer is an ion copolymer with an ion cross linkage of alkali metals and alkaline earth metals. The wrapping film 5 is made by the inflation process. The inflation process is a method for continuously making the film by swelling with air the resin injected from an extruder. The cartridge case 1 obtains a perfect sealed condition by the hot sealing of this wrapping film 5 at least around the drawer entrance 2, and preferably about the entire case 1.

Test results show the effectiveness of this invention. First, two capsule sheets were stored for 96 hours at 80° C. a first one in a cartridge which was not airtight and the second in the airtight cartridge of this embodiment. In addition, a third microcapsule sheet which was exposed without storage was used for comparison. The amount of exposure of the third sheet exposed without storage is 2820 lumen.sec/m$^2$, and that of the conventionally stored first sheet is 3660 lumen.sec/m$^2$ and that of the second sheet of this embodiment is 3100 lumen.sec/m$^2$. The reason why these values are different is that the sensitivity of each capsule sheet is different according to whether it has been stored or not. Therefore, the above-mentioned amounts of exposure were determined by estimating the optimum amount of exposure used when the image was formed bY the analog type photo sensitive and pressure sensitive copier, in which it is possible to adjust the amount of exposure. The exposed capsule sheet was superposed on the developer sheet (i.e., pressed on the developer sheet by a line pressure of 50 kg/cm) and thereby the developer sheet was colored. Then, the density of black (BK), yellow (Y), magenta color (M), and cyan color (C) of this developer sheet was examined.

The microcapsule sheet 4 used in this example is the microcapsule sheet of the photo sensitive and pressure sensitive type described in detail in the Japanese Patent Laid-Open No. 150242/1987 (corresponding U.S. Pat. No. 4,865,942 the disclosure of which is herein incorporated by reference). The result of the above-mentioned test is shown in the following table in which the sheet which was not stored is the third sheet, the compared sheet which was conventionally stored in a non-airtight housing is the first sheet, and the sheet which was stored in the sealed housing of the embodiment is the second sheet. The unit of density in the table has no dimension and a relatively low value shows that the reproducibility of the image is good.

|  | density | | | |
| --- | --- | --- | --- | --- |
|  | BK | Y | M | C |
| Third Sheet (not stored) stored | 0.06 | 0.08 | 0.07 | 0.05 |
| Second Sheet (this embodiment) | 0.08 | 0.12 | 0.09 | 0.06 |
| First Sheet (compared sheet) | 0.12 | 0.25 | 0.13 | 0.08 |

As a result, it is natural that the color density becomes lowest when the capsule sheet is used at once without storing so that a good result is obtained. In case that the two stored capsule sheets are compared, the color density of the capsule sheet of this embodiment was lower than that of the conventionally stored sheet, and the color density of the sheet stored in accordance with this invention was near to the color density of the capsule sheet without storing. Therefore, it is clear that this invention is effective.

In this embodiment, one side coat paper of thickness 210 μm is used for the cartridge case 1 and the side plates 1a and 1b, but metal and plastic also can be used. Further, it is possible to use polyethylene, polypropylene, and polyvinylidene chloride, etc. as the wrapping film 5. Moreover, inert gas such as helium, neon, and argon can be used instead of nitrogen gas.

This invention has been described with reference to a preferred embodiment which is intended to be illustrative and not limiting. This invention is not specially limited to the above-mentioned embodiment. Various changes may be made without departing from the spirit and scope of the invention as defined in the appended claims.

What is claimed is:

1. A microcapsule-carrying sheet storage cartridge, comprising:
   a sealed housing containing a microcapsule-carrying sheet; and a non-oxidative gas filled in the housing.

2. The cartridge as claimed in claim 1 wherein the non-oxidative gas contains nitrogen gas.

3. The cartridge as claimed in claim 1 wherein the non-oxidative gas contains at least one inert gas selected from the group consisting of helium, neon, argon and xenon.

4. The cartridge as claimed in claim 1, wherein the microcapsule-carrying sheet includes at least one photosensitive microcapsule on a base sheet of the microcapsule-carrying sheet.

5. The cartridge as claimed in claim 1 wherein the sealed housing includes drawer entrance means for withdrawing the microcapsule-carrying sheet from the housing, and a film means covering at least the drawer entrance means for sealing the drawer entrance means.

6. The cartridge as claimed in claim 1, wherein the sealed housing includes an injection port for injecting the non-oxidative gas into the sealed housing.

7. The cartridge as claimed in claim 6, wherein the sealed housing further includes drawer entrance means for withdrawing the microcapsule-carrying sheet from the housing and the drawer entrance means is provided at a position remote from the injection port in the housing.

8. The cartridge as claimed in claim 1 wherein the microcapsule-carrying sheet is rolled for storage in the housing.

9. The cartridge as claimed in claim 8 wherein the housing includes a supply shaft on which the microcapsule-carrying sheet is rolled.

10. The cartridge as claimed in claim 9, wherein the supply shaft is supported by the housing.

11. A microcapsule-carrying sheet storage cartridge comprising:
    a sealed housing containing a microcapsule-carrying sheet;
    drawer entrance means in the housing for withdrawing the microcapsule-carrying sheet from the housing;
    film means for covering at least the drawer entrance means of the housing; and
    a non-oxidative gas filled in the sealed housing.

12. The cartridge as claimed in claim 11 wherein the film means is a wrapping film including a synthetic resin film and an ionomer film laminated to the synthetic resin film.

13. The cartridge as claimed in claim 11 wherein the microcapsule-carrying sheet is rolled within the sealed housing such that a leader portion of the rolled sheet protrudes from the drawer entrance means, and the film means covers the drawer entrance means and the leader portion of the rolled sheet.

14. The cartridge as in claim 11 wherein the non-oxidative gas contains nitrogen gas.

15. The cartridge as in claim 11, wherein the non-oxidative gas contains at least one inert gas selected from the group consisting of helium, neon, argon and xenon.

16. The cartridge as claimed in claim 11 wherein the sealed housing includes an injection port for injecting the non-oxidative gas into the sealed housing.

17. The cartridge as claimed in claim 16 wherein the injection port is located at a position remote from drawer entrance means.

18. A method for storing a microcapsule-carrying sheet in a cartridge comprising the steps of:
　placing the microcapsule-carrying sheet in a housing of the cartridge;
　filling the housing with a non-oxidative gas; and
　sealing the housing.

19. The method as in claim 18 wherein the step of sealing the housing includes wrapping a film around the housing to seal the housing.

20. The method of claim 19 wherein the film is manufactured by an inflation process.

21. The method of claim 19 wherein the film is a laminated film having a synthetic resin film and an ionomer film laminated to the synthetic resin film.

22. The method as in claim 18 wherein the housing includes a drawer entrance for withdrawing the sheet from the housing; and the step of sealing the housing includes the step of wrapping the film over at least the drawer entrance to seal the housing.

23. The method of claim 22 wherein the step of filling the housing with non-oxidative gas includes the step of exhausting air out of the drawer entrance while filling the housing with non-oxidative gas.

24. The method of claim 22, wherein the step of filling the housing with non-oxidative gas includes the step of exhausting air out of the drawer entrance before sealing the drawer entrance.

25. The method of claim 18 wherein the non-oxidative gas contains nitrogen gas.

26. The method of claim 18 wherein the non-oxidative gas contains at least one inert gas selected from the group consisting of helium, neon, argon and xenon.

27. The method as claimed in claim 18, wherein the step of placing the microcapsule-carrying sheet in the housing includes rolling the microcapsule-carrying sheet for storage in the housing.

* * * * *